(12) United States Patent
Won et al.

(10) Patent No.: US 7,888,773 B2
(45) Date of Patent: Feb. 15, 2011

(54) SEMICONDUCTOR INTEGRATED CIRCUIT DEVICE HAVING MIM CAPACITOR AND METHOD OF FABRICATING THE SAME

(75) Inventors: Seok-Jun Won, Seoul (KR); Jung-Min Park, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 301 days.

(21) Appl. No.: 11/588,575

(22) Filed: Oct. 27, 2006

(65) Prior Publication Data

US 2007/0267705 A1 Nov. 22, 2007

(30) Foreign Application Priority Data

May 22, 2006 (KR) .................. 10-2006-0045712

(51) Int. Cl.
*H01L 29/94* (2006.01)
(52) U.S. Cl. .................. 257/532; 257/534; 257/309; 257/E27.084
(58) Field of Classification Search .................. 257/296, 257/309, 532, 534
See application file for complete search history.

(56) References Cited

U.S. PATENT DOCUMENTS

| | | | |
|---|---|---|---|
| 5,393,691 A | 2/1995 | Hsu et al. | 437/60 |
| 5,434,098 A | 7/1995 | Chang | 437/60 |
| 5,631,188 A | 5/1997 | Chang et al. | 438/253 |
| 6,239,010 B1 * | 5/2001 | Lu | 438/592 |
| 6,333,224 B1 | 12/2001 | Lee | |
| 6,492,223 B2 * | 12/2002 | Kanamori et al. | 438/240 |
| 2002/0006700 A1 | 1/2002 | Kanamori et al. | |
| 2005/0087879 A1 | 4/2005 | Won et al. | |

FOREIGN PATENT DOCUMENTS

| | | |
|---|---|---|
| KR | 10-2001-0008592 | 2/2001 |
| KR | 1020010019262 A | 3/2001 |
| KR | 1020030046204 A | 6/2003 |
| KR | 1020050040464 A | 5/2005 |

OTHER PUBLICATIONS

Chinese Office Action dated Nov. 20, 2009, issued in corresponding International Application No. 200710111466.9 and English translation.

* cited by examiner

*Primary Examiner*—Jack Chen
(74) *Attorney, Agent, or Firm*—Mills & Onello, LLP

(57) ABSTRACT

In a semiconductor integrated circuit device and a method of formation thereof, a semiconductor device comprises: a semiconductor substrate; an insulator at a top portion of the substrate, defining an insulator region; a conductive layer pattern on the substrate, the conductive layer pattern being patterned from a common conductive layer, the conductive layer pattern including a first pattern portion on the insulator in the insulator region and a second pattern portion on the substrate in an active region of the substrate, wherein the second pattern portion comprises a gate of a transistor in the active region; and a capacitor on the insulator in the insulator region, the capacitor including: a lower electrode on the first pattern portion of the conductive layer pattern, a dielectric layer pattern on the lower electrode, and an upper electrode on the dielectric layer pattern.

21 Claims, 10 Drawing Sheets

| | Enlargement Methods (Wet/time) | Bottom electrode | Removal method at the side wall of capacitor pattern (wet/time) |
|---|---|---|---|
| 1 | HF/600s | IPVD-TiN 200Å | PAN/120s |
| 2 | HF/600s | IPVD-TiN 200Å | PAN/180s |
| 3 | HF/600s | PVD-TiN 200Å | PAN/120s |
| 4 | HF/600s | PVD-TiN 200Å | PAN/180s |
| 5 | LAL/20s | PVD-TiN 200Å | PAN/60s |
| 6 | LAL/20s | PVD-TiN 200Å | PAN/120s |
| 7 | LAL/20s | IPVD-TiN 200Å | PAN/60s |
| 8 | LAL/20s | IPVD-TiN 200Å | PAN/120s |

SEMICONDUCTOR INTEGRATED CIRCUIT DEVICE HAVING MIM CAPACITOR AND METHOD OF FABRICATING THE SAME

RELATED APPLICATIONS

This application claims priority under 35 U.S.C. §119 to Korean Patent Application No. 10-2006-0045712 filed on May 22, 2006, the content of which is incorporated herein by reference in its entirety.

BACKGROUND OF THE INVENTION

Semiconductor integrated circuit devices commonly employ capacitors that are integrated directly into the devices. Such integrated capacitors include first and second electrodes that are spaced apart by a dielectric layer. In integrated devices, capacitors have been formed in a number of different configurations, including MOS (metal-oxide-semiconductor) capacitors, PN junction capacitors, PIP (polysilicon-insulator-polysilicon) capacitors, and MIM (metal insulator-metal) capacitors, each being characterized by the types of materials used to form the electrodes and dielectric layer.

The MOS and PIP capacitor types employ a polycrystalline semiconductor layer or single-crystal semiconductor layer as an electrode of the capacitor, and the PN junction capacitor types employ a doped single-crystal semiconductor as a bottom electrode. It is well understood that such polycrystalline semiconductor or single-crystal semiconductor materials exhibit a resistivity that is higher than that of metal. In addition, when a bias voltage is applied to a capacitor electrode formed of a polycrystalline semiconductor or single-crystal semiconductor material, a depletion region is generated, causing the applied bias voltage to become unstable, in turn causing an undesirable variation in the capacitance value of the capacitor. Variation in the capacitance value of a capacitor makes the capacitor highly dependent on the frequency of the signal applied to the capacitor. To improve the signal-to-noise ratio (SNR) in CMOS logic analog devices, such as analog-to-digital converters, and the like, it is desirable to decrease the voltage coefficient of capacitance, or VCC, of a CMOS analog capacitor. A decrease in VCC means that the change in capacitance is relatively low in response to a variation in applied voltage. The VCC value is characterized by:

$$VCC = \frac{1}{C_0}\left(\frac{dC}{dV}\right),$$

where $C_0$ is the nominal capacitance of the device, and where (dC/dV) is the variation of capacitance in response to applied voltage.

MIM capacitors, on the other hand, employ metal materials for forming the capacitor electrodes. As a result, the capacitor electrodes have lower resistivity. Lower resistivity leads to a more stable capacitance value in the resulting capacitor, in turn leading to reduced frequency dependence. When a bias voltage is applied to a capacitor electrode formed of metal, little or no depletion region is generated, and therefore, it is possible to achieve a stable capacitance value, despite variation in applied voltage.

With such stable capacitance properties, MIM capacitors enjoy widespread application in integrated devices, such as analog devices, system-on-a-chip (SoC) devices, and mixed mode signal applications. For example, such MIM capacitors are readily applied to CMOS image sensor s(CIS), LCD driver ICs (LDI), RF filter devices, and the like.

A conventional PIP capacitor includes first and second electrodes formed of polysilicon that are separated by an insulating capacitor dielectric layer. Fabrication of a PIP capacitor is relatively simple, since only a single additional photomask is required for forming the capacitor components. In addition, PIP capacitors are generally formed on a lower level of the device, and as a result, enjoy enhanced wiring characteristics, since a wide routing area for metal interconnection is available, since metal interconnection lines on the upper-level layers, such as the metal-1 and metal-2 layers, can be routed directly over the position of the PIP capacitor, without interfering with the capacitor. However, as stated above, such PIP capacitors suffer from high capacitance variation, as the polysilicon electrode characteristically includes a depletion region. The depletion region prevents applicability of the PIP capacitor to formation of a high value performance capacitor, having a high capacitance value, and a low VCC value.

In contrast, a conventional MIM capacitor offers high-performance operation, but interferes with upper-level wiring because MIM capacitors have large top and bottom electrodes that are formed in the metal wiring layers, such as the metal-1, metal-2 and upper-level layers. Therefore, the electrodes occupy space that would otherwise be occupied by interconnection lines in the metal layers. In addition, at least two additional photolithography masks are generally required for forming an integrated MIM capacitor to define top and bottom plates, respectively, in order to complete fabrication of the device, complicating fabrication of the device.

SUMMARY OF THE INVENTION

Embodiments of the present invention disclosed herein are directed to semiconductor devices including MIM-type capacitors, and methods of fabrication thereof. In particular, semiconductor devices are disclosed that each include an MIM-type capacitor that is formed on a patterned conductor layer that is used to form a gate layer of a transistor on another portion of the semiconductor device. The resulting MIM-type capacitor provides high-performance operation, as the electrodes are formed of a metal material, and therefore do not have a significant depletion region, and also provides a wide routing area for metal interconnection, since the MIM-type capacitor is formed below the lower routing layers of the device. Methods of forming such MIM-type capacitor devices are also disclosed.

In a first aspect, a semiconductor device comprises: a semiconductor substrate; an insulator at a top portion of the substrate, defining an insulator region; a conductive layer pattern on the substrate, the conductive layer pattern being patterned from a common conductive layer, the conductive layer pattern including a first pattern portion on the insulator in the insulator region and a second pattern portion on the substrate in an active region of the substrate, wherein the second pattern portion comprises a gate of a transistor in the active region; and a capacitor on the insulator in the insulator region, the capacitor including: a lower electrode on the first pattern portion of the conductive layer pattern, a dielectric layer pattern on the lower electrode, and an upper electrode on the dielectric layer pattern.

The substrate can comprise one selected from the group consisting of: a bulk semiconductor substrate, a silicon-on-insulator structure, and a semiconductor substrate having an epitaxial layer grown thereon.

The insulator can comprise a shallow trench isolation (STI) or local oxidation of silicon (LOCOS) structure. In one embodiment, the conductive layer comprises polysilicon.

The semiconductor device can further comprise a gate insulator layer pattern on the substrate below the second pattern portion of the conductive layer pattern in the active region.

The gate insulator layer pattern can optionally be further on the insulator below the first pattern portion of the conductive layer pattern in the insulator region.

The lower electrode can comprise a metal selected from the group consisting of: Ti, Ta, W, Hf, Zr, TiN, TaN, WN, HfN, ZrN, and alloys thereof.

The dielectric layer pattern can comprise a dielectric material selected from the group consisting of: a high-k dielectric material, an oxide material, and an oxide-nitride-oxide (ONO) structure.

The upper electrode can comprise a first upper electrode layer pattern on the dielectric layer pattern and a second upper electrode layer pattern on the first upper electrode layer pattern.

The first upper electrode layer pattern can comprise a metal selected from the group consisting of: TiN, TaN, WN, HfN, ZrN, and other metal nitrides.

The second upper electrode layer pattern can comprise a metal selected from the group consisting of: Cu and W.

The dielectric layer can be further positioned along sidewalls of the upper electrode.

The semiconductor device can further comprise an interlayer insulator layer on the substrate, wherein the capacitor is formed through the interlayer insulator layer.

The capacitor can further be on a portion of the first pattern portion of the conductive layer pattern, wherein a lower electrode contact extends through the interlayer insulator layer and contacts an upper surface of another portion of the first pattern portion of the conductive layer pattern.

The semiconductor device can further comprise an upper electrode contact that extends through the interlayer insulator layer and contacts an upper surface of the upper electrode. The upper electrode contact can comprise multiple contacts. The interlayer insulator layer can comprise a first interlayer insulator layer and the semiconductor device can further comprise a second interlayer insulator layer on the capacitor and on the first interlayer insulator layer, and the upper electrode contact extends through the second interlayer insulator layer to contact the upper surface of the upper electrode.

The semiconductor device can further comprise an interconnect via on the second interlayer insulator layer contacting the upper electrode contact.

The semiconductor device can further comprise interconnect vias on the interlayer insulator layer and on the capacitor, at least one of the interconnect vias being in direct contact with the upper electrode.

In another aspect, a method of forming a semiconductor device comprises: providing an insulator at a top portion of a semiconductor substrate, defining an insulator region; providing a conductive layer on the substrate and patterning the conductive layer to form a conductive layer pattern including a first pattern portion on the insulator in the insulator region and a second pattern portion on the substrate in an active region of the substrate; providing a capacitor on the insulator in the insulator region, by: providing a lower electrode on the first pattern portion of the conductive layer pattern, providing a dielectric layer pattern on the lower electrode, and providing an upper electrode on the dielectric layer pattern.

The second pattern portion can comprise a gate of a transistor in the active region.

Providing the insulator can comprise providing the insulator using a process selected from the group consisting of shallow trench isolation (STI) and local oxidation of silicon (LOCOS).

The conductive layer can comprise polysilicon.

The method can further comprise providing a gate insulator layer pattern on the substrate in the active region prior to providing the conductive layer.

The method can further comprise providing a gate insulator layer pattern on the substrate in the insulator region prior to providing the conductive layer.

The lower electrode can comprise a metal selected from the group consisting of: Ti, Ta, W, Hf, Zr, TiN, TaN, WN, HfN, ZrN, and alloys thereof.

The dielectric layer pattern can comprise a dielectric material selected from the group consisting of: a high-k dielectric material, an oxide material, and an oxide-nitride-oxide (ONO) structure.

The upper electrode can comprise a first upper electrode layer pattern on the dielectric layer pattern and a second upper electrode layer pattern on the first upper electrode layer pattern.

The first upper electrode layer pattern can comprise a metal selected from the group consisting of TiN, TaN, WN, HfN, ZrN, and other metal nitrides.

The second upper electrode layer pattern can comprise a metal selected from the group consisting of Cu and W.

Providing a capacitor can comprise: providing an interlayer insulator layer on the substrate and on the conductive layer pattern; patterning the interlayer insulator layer to form an opening that exposes a portion of the first pattern portion of the conductive layer pattern; providing a lower electrode layer on a bottom and inner sidewalls of the opening; etching the lower electrode layer to form the lower electrode layer pattern on the bottom of the opening; providing a dielectric layer on the lower electrode layer; providing an upper electrode layer on the dielectric layer; and performing a planarization process to expose the interlayer insulating layer below the upper electrode layer and the dielectric layer to provide the dielectric layer pattern and the upper electrode layer pattern.

In one embodiment, etching the lower electrode layer removes the electrode layer from the inner sidewalls of the opening.

The method can further comprise providing a sacrificial layer on the interlayer insulator layer prior to patterning the interlayer insulator layer, and wherein patterning further comprises patterning the sacrificial layer and the interlayer insulator layer to form a first opening.

The method can further comprise enlarging the first opening to provide a second opening using an etching process.

In one embodiment, following enlarging, an undermined portion of the sacrificial layer is suspended over the second opening.

In one embodiment, the capacitor is on a portion of the first pattern portion of the conductive layer pattern, and the method can further comprise forming a lower electrode contact that extends through the interlayer insulator layer and contacts an upper surface of another portion of the first pattern portion of the conductive layer pattern.

The method can further comprise forming an upper electrode contact that extends through the interlayer insulator layer and contacts an upper surface of the upper electrode.

The method can further comprise forming the upper electrode contact with multiple contacts.

In one embodiment, the interlayer insulator layer comprises a first interlayer insulator layer and the method further comprises, following performing the planarization process, forming a second interlayer insulator layer on the capacitor and on the first interlayer insulator layer, wherein the upper electrode contact extends through the second interlayer insulator layer to contact the upper surface of the upper electrode. The method can further comprise forming an interconnect via on the second interlayer insulator layer contacting the upper electrode contact.

Following performing the planarization process, the method can further comprise forming interconnect vias on the interlayer insulator layer and on the capacitor, at least one of the interconnect vias being in direct contact with the upper electrode.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS OF THE INVENTION

Exemplary embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element or layer is referred to as being "on" another element or layer, it can be directly on the other element or layer, or intervening elements or layers may be present.

It will be understood that when an element or layer is referred to as being "connected" or "coupled" to another element or layer, it can be directly connected or coupled to the other element or layer or intervening elements or layers may be present. In contrast, when an element or layer is referred to as being "directly connected" or "directly coupled" to another element or layer, there are no intervening elements or layers present. Other words used to describe the relationship between elements or layers should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

As used herein, the term "substrate" refers to any of a number of substrate types, including, but not limited to, a bulk semiconductor substrate, a silicon-on-insulator (SOI) structure, or an epitaxial layer, for example a single-crystal layer, that is grown on a bulk substrate.

FIGS. 1A through 1F are cutaway side views of a method of fabricating an integrated MIM capacitor device, and an integrated MIM capacitor device formed according to the method, in accordance with a first embodiment of the present invention.

Figure 1A:
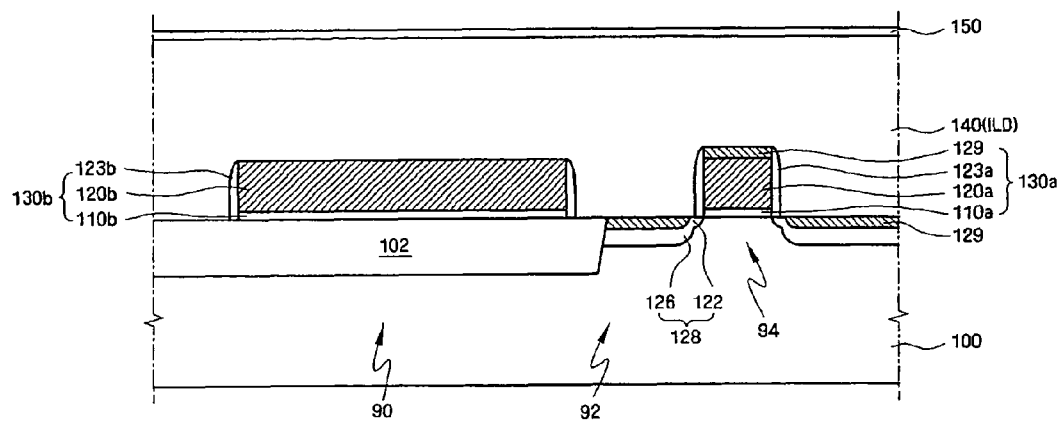
FIGS. 1A through 1F are cutaway side views of a method of fabricating an integrated MIM capacitor device, and an integrated MIM capacitor device formed according to the method, in accordance with a first embodiment of the present invention.
Figure 1B:
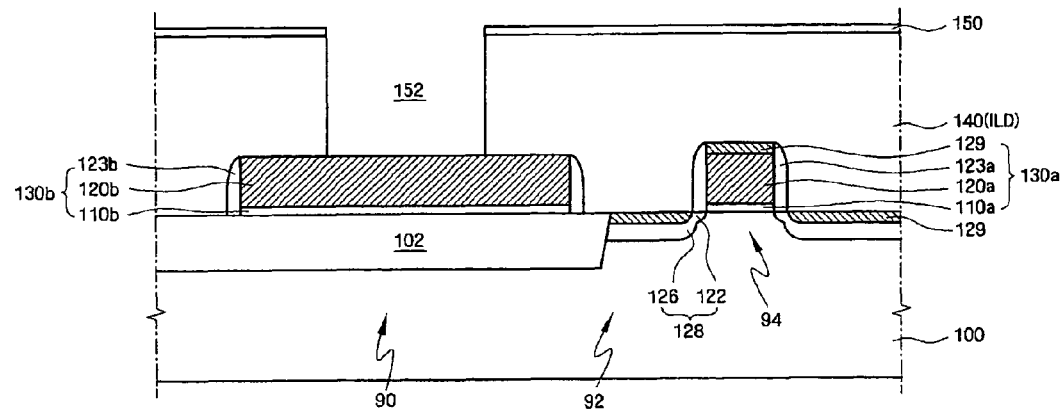
Figure 1C:
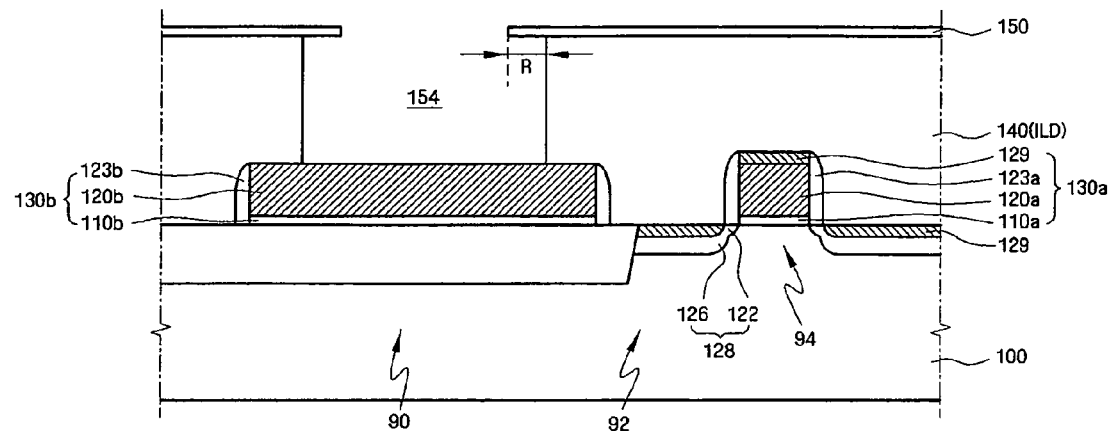
Figure 1D:
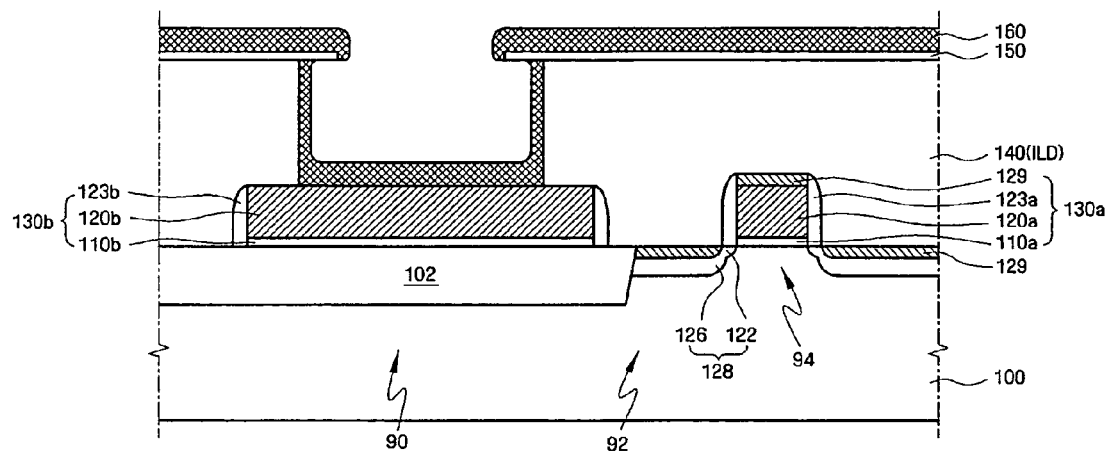
Figure 1E:
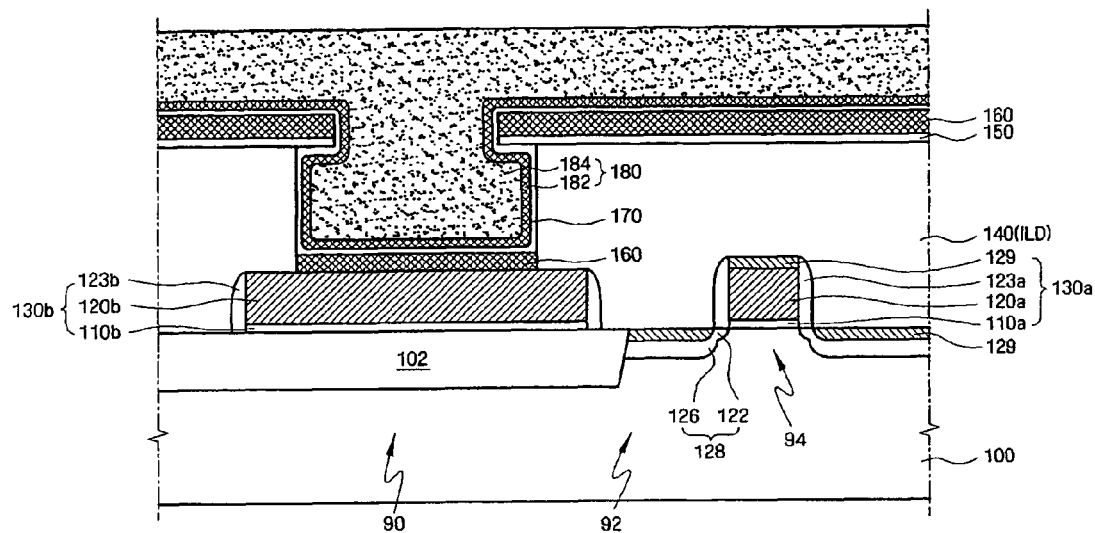
Figure 1F:
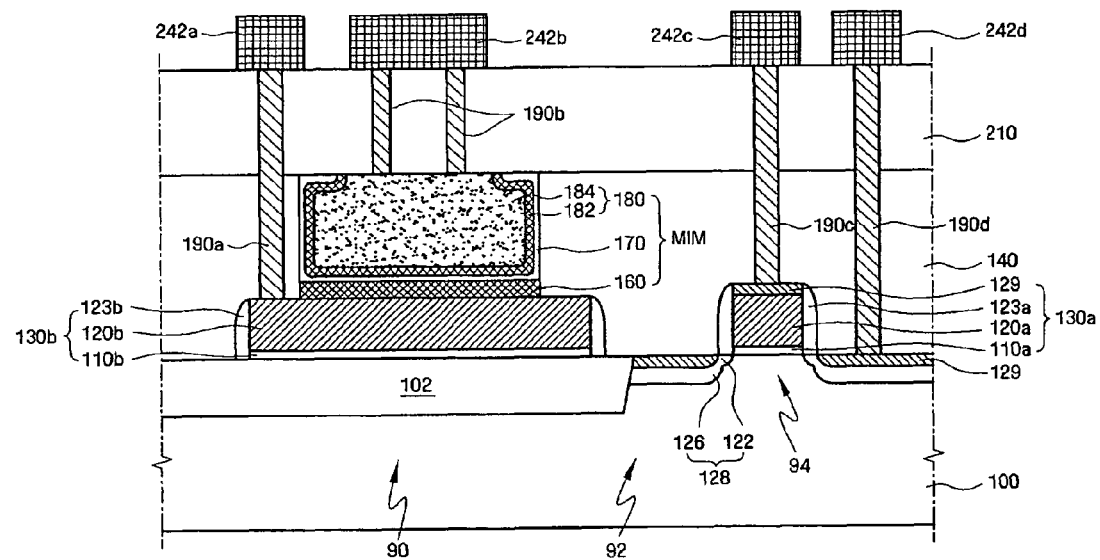

With reference to FIG. 1F, an MIM capacitor device in accordance with a first embodiment of the disclosure comprises a substrate 100. A field oxide structure 102 is formed in the substrate 100 to define an isolated region 90 and an active region 92 of the substrate 100. In the active region 92, active devices, such as transistors 94, can be formed. In this example, the transistor 94 includes a first gate stack 130a formed on an active region of the substrate. Source and drain regions 128 are formed in the substrate 100 at left and right sides of the first gate stack 130a.

An MIM-type capacitor structure MIM is formed on the field oxide region 102, the field oxide region 102 isolating the MIM-type capacitor MIM from the active region 92 of the substrate. The MIM-type capacitor components are formed on a second gate stack 130b structure that is formed at the same time, and of the same materials, as the first gate stack structure. The second gate stack 130b does not operate as a gate of a transistor, but instead operates as an interconnection pathway between a lower electrode 160 of the MIM-type capacitor MIM and a vertical contact 190a for the lower electrode that is connected to upper level vias 242a.

The MIM-type capacitor structure includes a lower electrode 160 in contact with the polysilicon layer pattern 120b of the second gate stack 130b, a capacitor dielectric 170 on the lower electrode 160, and an upper electrode 180 on the capacitor dielectric 170. In one embodiment, the upper electrode 180 includes a first upper electrode layer 182 that operates as an adhesion layer and a second upper electrode layer 184 that operates as a metal fill layer. An first interlayer dielectric (ILD) 140 and a second ILD 210 are provided on the resulting MIM-type capacitor MIM and transistor. Vertical contacts 190a, 190b, 190c, 190d are provided through the first and second ILD layers 140, 210 to provide conductive paths between the first and second electrodes 160, 180 of the MIM-type capacitor MIM and upper level interconnection vias 242a, 242b, and to provide conductive paths between the gate 130a and source/drain 128 of the transistor in the active region, and the upper level interconnection vias 242c, 242d.

An exemplary method of fabricating the integrated semiconductor device including an MIM capacitor of FIG. 1F will now be described with reference to FIGS. 1A through 1F.

Referring to FIG. 1A, a field oxide structure 102 is formed in the substrate 100 to define an isolated region 90 and an active region 92 of the substrate 100. In one example, the field oxide region 102 is formed using a shallow trench isolation (STI) process or a LOCOS process, according to well-known isolation structure formation techniques. The field oxide region can be formed, in different embodiments, in, on, or above, the substrate 100.

In the active region, active devices, such as transistors 94, can be formed. In this example, a first gate stack 130a is stacked and patterned on an active region of the substrate, and, using the same materials as the first gate stack 130a, a second gate stack 130b is stacked and patterned on the field oxide region 102. In one example, the first and second gate stacks comprise a gate oxide layer 110 and a gate polysilicon layer 120 that are patterned to form first and second gate oxide layer patterns 110a, 110b, and first and second gate polysilicon layer patterns 120a, 120b. In the active region 92, a silicide layer 129 may be formed on the second gate polysilicon pattern 120a to reduce resistivity of the gate, and may be formed on the source/drain regions 128 to reduce resistivity of the contacts in these regions according to conventional techniques. In the exemplary embodiment of FIG. 1A, an optional silicide blocking layer is provided on the second gate polysilicon pattern 120b to prevent formation of silicide on the second gate polysilicon pattern 120b. In another embodiment, a silicide layer can be formed on the second gate polysilicon pattern 120b. First and second sidewall spacers 123a, 123b are then formed on the first and second gate stacks 130a, 130b by applying an insulating layer that is anisotropically etched, according to well-known sidewall spacer formation techniques.

In the present exemplary embodiment, source and drain regions 128 are formed in the substrate 100 at left and right sides of the first gate stack 130a using ion implantation. Each of the source and drain regions 128 can include heavily doped 126 and lightly doped 122 regions, as is well-known in the art of transistor fabrication technology.

An interlayer dielectric layer (ILD) 140 is then formed on the resulting structure. In one embodiment, the ILD layer 140 comprises silicon oxide. The ILD is then planarized using, for example, a chemical-mechanical polishing (CMP) procedure. A sacrificial layer 150 is then provided on the planarized ILD 140. In various embodiments, the sacrificial layer comprises TiN, TaN, SiN, metal nitride, or other materials that have wet etch selectivity with respect to the silicon oxide material of the ILD layer 140.

Referring to FIG. 1B, the sacrificial layer 150 and ILD 140 are etched using a photolithography mask pattern to form a capacitor opening 152 in the ILD. In the present embodiment, only a single photolithography mask is necessary for forming the capacitor opening 152 which will define the eventual positions of the capacitor components. This leads to more efficient fabrication of the integrated MIM capacitor.

Referring to FIG. 1C, the capacitor opening 152 is enlarged to form an enlarged capacitor opening 154. In this process, the ILD 140 is selectively etched while the sacrificial layer 150 remains. In this manner, the sacrificial layer is undermined at sidewalls of the enlarged opening 154 by a length R, the extent of which is a function of the duration of the etching procedure. In the enlarging procedure, oxide etchants such as LAL or HF can be used to enlarge the opening 152, while minimally etching, or not etching, the sacrificial layer 150.

Referring to FIG. 1D, a metal layer 160 is deposited on the resulting structure, including on the sacrificial layer 150, and on the inner sidewalls and bottom surface of the enlarged capacitor opening 154. In one example, the metal layer 160 is deposited using a sputtering process. The metal layer 160 comprises, for example, a material selected from the group consisting of Ti, Ta, W, Hf, Zr, TiN, TaN, WN, HfN, ZrN, and combinations of these materials. The portion of the metal layer 160 that lies on the bottom surface of the enlarged opening 154 will become the lower electrode of the capacitor in subsequent processes. During the deposition, it is therefore desired that the bottom portion of the metal layer 160 that is deposited on the bottom surface of the enlarged opening 154 is sufficiently thick, so that a sufficient amount of material to form the lower electrode will remain following a wet etch of the top portion of the metal layer that lies on the sacrificial layer 160.

Referring to FIG. 1E, the metal layer 160 is segmented into separated portions using an etching process, for example, a wet etching process. As a result of the wet etch, the sidewalls of the metal layer 160 that formerly coated the inner sidewalls of the enlarged capacitor opening 154 and the portions of the metal layer 160 that formerly coated the side surface of the undermined portion of the sacrificial layer 150, are removed. Accordingly, a first portion of the metal layer 160 at the bottom surface of the enlarged capacitor opening remains, to provide a lower electrode 160 for the MIM capacitor. A second portion of the metal layer 160 on the sacrificial layer 150 also remains at this time.

A capacitor dielectric layer 170 is then formed on the resulting structure, coating the second portion of the metal layer 160 on the sacrificial layer 150, coating the inner sidewalls of the second portion of the metal layer 160 and the sacrificial layer, coating the undermined portion of the sacrificial layer 150, and coating the inner sidewalls and a bottom surface of the enlarged capacitor opening 154 on the lower electrode 160. In exemplary embodiments, the capacitor dielectric layer 170 comprises a material selected from the group of materials consisting of a high-k dielectric material, an oxide, an oxide-nitride-oxide structure, and combinations thereof.

A capacitor upper electrode layer 180 is then provided on the resulting structure, covering the top and side surfaces of the capacitor dielectric layer 170, and filling the enlarged capacitor opening. In one example, the upper electrode layer 180 comprises a first upper electrode layer 182 and a second upper electrode layer 184. The first upper electrode layer 182 comprises a thin layer that promotes adhesion of the first upper electrode layer with the capacitor dielectric layer, and has diffusion barrier properties, and can comprise, for example, a material selected from the group consisting of TiN, TaN, WN, HfN, ZrN, other metal nitrides, and combinations thereof. The second upper electrode layer 184 comprises a metal fill material that offers superior fill properties, and low resistance, and can comprise, for example, Cu or W.

Referring to FIG. 1F a polishing process is performed, for example a chemical-mechanical polishing (CMP) process to remove material from the structure so that the ILD layer 140 is exposed. The top portions of the second upper electrode layer 184, the first upper electrode layer 182, the capacitor dielectric layer 170, the metal layer 160, and the sacrificial layer 150 that lie above the level of the top of the ILD layer 140 are thereby removed. The MIM-type capacitor MIM, including the lower electrode 160, the capacitor dielectric layer 170, and the upper electrode 180 comprising the first and second upper electrode layers 182, 184, is thereby formed on the upper surface of the second gate stack 130b. In this embodiment, a second ILD layer 210 is formed on the resulting structure, and is planarized. The second ILD layer 210 is formed to a desired height such that upper level interconnection vias 242a, 242b, 242c, 242d formed on the second ILD layer 210 lie at a desired level. Prior to formation of the vias, contact holes are formed through the second and first ILD layers 210, 140 to expose an upper region of the second gate polysilicon layer pattern 120b, the upper capacitor electrode 184, the silicide layer 129 on the first gate stack 130a and the silicide layer 129 on the source/drain region 128 of the transistor in the active region. A metal fill is then provided in the openings to form vertical contacts 190a, 190b, 190c, 190d. The vertical contact 190b coupled to the upper capacitor electrode 184 may optionally comprise multiple contacts 190b to decrease resistance and improve current flow. Although not shown in the drawings, the vertical contact 190a coupled to the second gate polysilicon pattern 120b/lower electrode 160 may also optionally comprise multiple contacts, for similar reasons. Because the top and bottom electrodes 180, 160 of the illustrated embodiment have low resistance, relative to the electrodes of the conventional PIP and MIM capacitor configurations, fewer vertical contacts can be used, which can increase the amount of area available for upper-level wiring. The upper level interconnection vias 242a, 242b, 242c, 242d are then formed on the second ILD layer 210 in contact with upper portions of the contacts 190a, 190b, 190c, 190d for routing the signals to other portions of the device.

In the above exemplary embodiment, only a single additional photomask is required for defining the components of the MIM-type capacitor. Thus, an improvement in fabrication efficiency is realized. In addition, since the capacitor is an MIM-type capacitor, it offers the characteristically advantageous VCC properties. In addition, because the MIM-type capacitor of the present embodiment is formed on a lower level of the device, directly above the substrate, a wide routing area can be provided above the device.

It is desired that the capacitor lower electrode 160 is formed without sidewalls. With sidewalls present, during later CMP of the upper portions of the structure, shorting can possibly result between the sidewalls of the lower electrode 160 and the sidewalls of the upper electrode 180. Enlargement of the capacitor opening 154 to form the undermined region of the sacrificial layer 150 results in the formation of a relatively thinner sidewall of the lower electrode 160 in the opening and a relatively thicker bottom portion of the lower electrode layer, due to the shadowing of the lower electrode 160 in the inner sidewall regions arising from the presence of the undermined portion of the sacrificial layer 150. As a result, the subsequent wet etch of the lower electrode 160 removes entirely the sidewalls of the lower electrode 160, while a portion of the relatively thick portion of the metal layer 160 in the bottom portion of the enlarged opening remains. This ensures that sidewalls of the lower electrode 160 are not present when later performing CMP polishing on the upper portions of the capacitor structure, avoiding the shorting problem.

Figure 2:
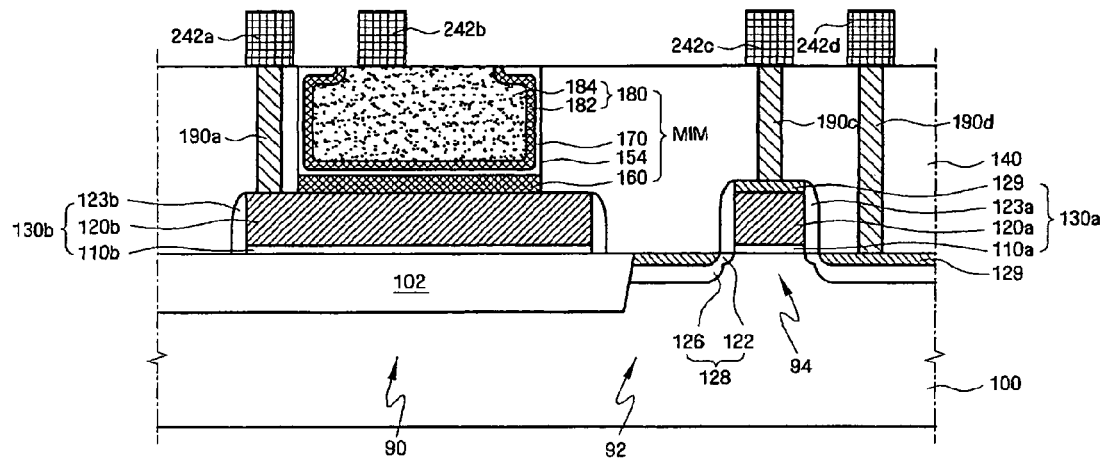
FIG. 2 is a cutaway side view of an integrated MIM capacitor device, in accordance with a second embodiment of the present invention.

FIG. 2 is a cutaway side view of an integrated MIM capacitor device, in accordance with a second embodiment of the present invention. The embodiment of FIG. 2 is substantially the same in structure, and can be fabricated in substantially the same manner, as that of the first embodiment. A difference in the present second embodiment lies in that following CMP polishing of the upper portions of the second upper electrode layer 184, the first upper electrode layer 182, the capacitor dielectric layer 170, the metal layer 160, and the sacrificial layer 150 that lie above the level of the top of the ILD layer 140, a second ILD layer 210 is not formed, as in the first embodiment. Instead, in the present second embodiment, contact holes are formed in the first ILD layer 140 at this time to expose an upper region of the second gate polysilicon layer pattern 120b, the silicide layer 129 on the first gate stack 130a and the silicide layer 129 on the source/drain region 128 of the transistor 94 in the active region 92. A metal fill is then provided in the openings to form vertical contacts 190a, 190c, 190d. The upper level interconnection vias 242a, 242c, 242d are then formed on the first ILD layer 140 in contact with upper portions of the contacts 190a, 190c, 190d for routing the signals to other portions of the device. In addition, the upper level interconnection via 242b is placed in direct contact with the upper electrode 180 of the MIM-type capacitor MIM. In this embodiment, fewer processing steps are required.

FIGS. 3A through 3E are cutaway side views of a method of fabricating an integrated MIM capacitor device, and an integrated MIM capacitor device formed according to the method, in accordance with a third embodiment of the present invention.

The present third embodiment is similar in structure and in formation method to the first embodiment. An exception lies in that in the present third embodiment, an enlargement process is not performed on the capacitor opening 152, the sacrificial layer is not present, and therefore, an undermined sacrificial layer is not present. As a result, shadowing of the inner sidewalls of the capacitor opening 152 by the sacrificial layer does not take place during deposition of the metal layer 160 that is used to form the lower capacitor electrode. Consequently, the sidewalls of the metal layer 160 formed in the capacitor opening are relatively thick as compared to those formed under the first embodiment.

Figure 3A:
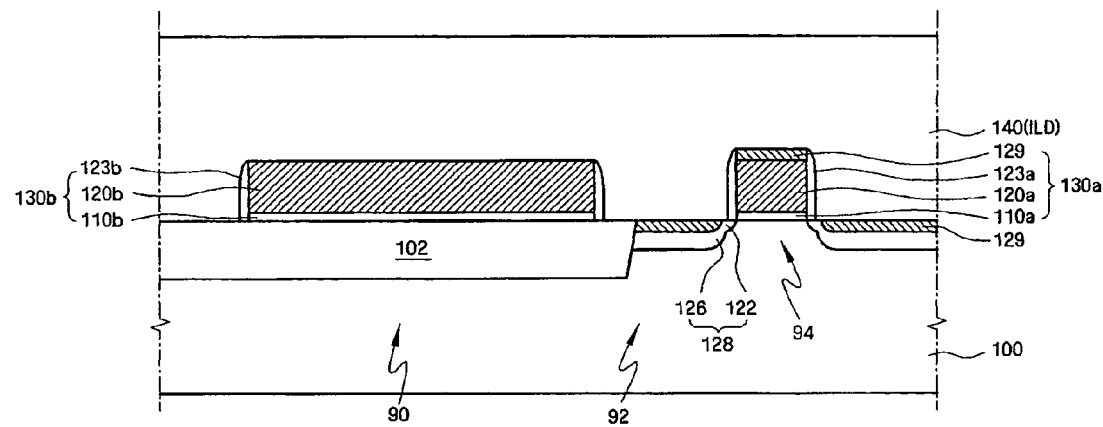
FIGS. 3A through 3E are cutaway side views of a method of fabricating an integrated MIM capacitor device, and an integrated MIM capacitor device formed according to the method, in accordance with a third embodiment of the present invention.

Referring to FIG. 3A, as in the first embodiment described above, a field oxide structure 102 is formed in the substrate 100 to define an isolated region 90 and an active region 92 of the substrate 100. In one example, the field oxide region 102 is formed using a shallow trench isolation (STI) process or a LOCOS process, according to well-known isolation structure formation techniques.

As in the first embodiment described above, in the active region, active devices, such as transistors 94, can be formed. In this example, a first gate stack 130a is stacked and patterned on an active region of the substrate, and, using the same materials as the first gate stack 130a, a second gate stack 130b is stacked and patterned on the field oxide region 102. In one example, the first and second gate stacks comprise a gate oxide layer 110 and a gate polysilicon layer 120 that are patterned to form first and second gate oxide layer patterns 110a, 110b, and first and second gate polysilicon layer patterns 120a, 120b. In the active region, a silicide layer 129 may be formed on the second gate polysilicon pattern 120a to reduce resistivity of the gate, and may be formed on the source/drain regions 128 to reduce resistivity of the contacts in these regions according to conventional techniques. In the exemplary embodiment of FIG. 3A, an optional silicide blocking layer is provided on the second gate polysilicon pattern 120b to prevent formation of silicide on the second gate polysilicon pattern 120b. In another embodiment, a silicide layer can be formed on the second gate polysilicon pattern 120b. First and second sidewall spacers 123a, 123b are then formed on the first and second gate stacks 130a, 130b by applying an insulating layer that is anisotropically etched, according to well-known sidewall spacer formation techniques.

In the present exemplary embodiment of FIG. 3A, source and drain regions 128 are formed in the substrate 100 at left and right sides of the first gate stack 130a using ion implantation. Each of the source and drain regions 128 can include heavily doped 126 and lightly doped 122 regions, as is well-known in the art of transistor fabrication technology.

As in the first embodiment described above, an interlayer dielectric layer (ILD) 140 is then formed on the resulting structure. In one embodiment, the ILD layer 140 comprises silicon oxide. The ILD is then planarized using, for example, a chemical-mechanical polishing (CMP) procedure.

Figure 3B:
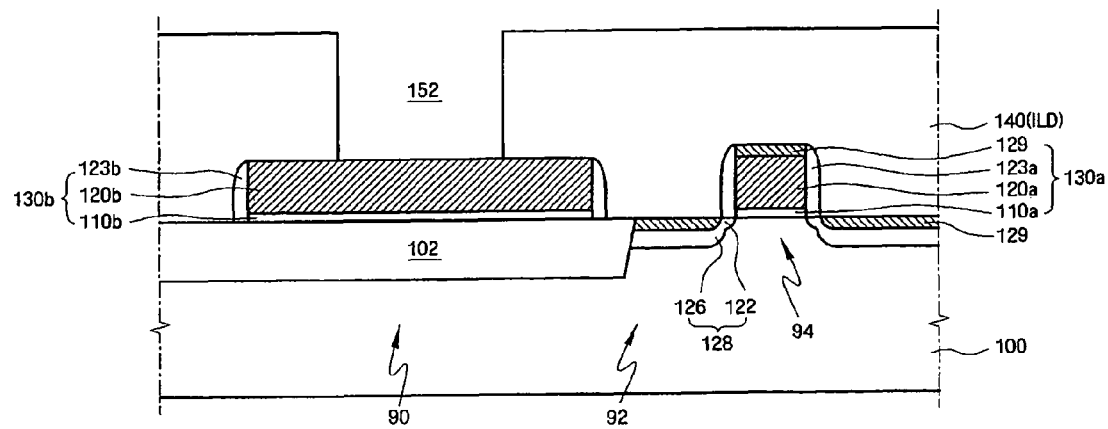

Referring to FIG. 3B, the ILD 140 is etched using a photolithography mask pattern to form a capacitor opening 152 in the ILD. In the present embodiment, only a single photolithography mask is necessary for forming the capacitor opening 152 which will define the eventual positions of the capacitor components. This leads to more efficient fabrication of the integrated MIM capacitor.

Figure 3C:
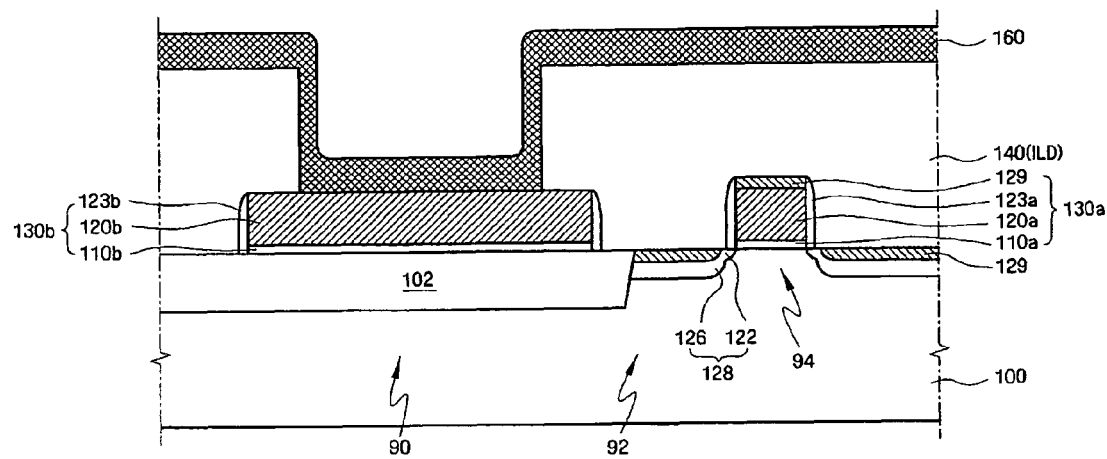

Referring to FIG. 3C, without having performed an enlargement procedure on the capacitor opening 152, a metal layer 160 is deposited on the resulting structure, including on the ILD 140, and on the inner sidewalls and bottom surface of the capacitor opening 152. In one example, the metal layer 160 is deposited using a sputtering process. The metal layer 160 comprises, for example, a material selected from the group consisting of Ti, Ta, W, Hf, Zr, TiN, TaN, WN, HfN, ZrN, and combinations of these materials. The portion of the metal layer 160 that lies on the bottom surface of the capacitor opening 152 will become the lower electrode of the capacitor in subsequent processes. During the deposition of the metal layer 160, since no shadowing of the inner sidewalls of the capacitor opening takes place in this third embodiment, it is desired that the bottom portion of the metal layer 160 that is deposited on the bottom surface of the capacitor opening 152 is sufficiently thick, as compared to the relatively thin sidewall portion of the metal layer that coats the sidewalls of the capacitor opening 152, so that a sufficient amount of material to form the lower electrode will remain following a wet etch of the top portion of the metal layer that lies on the ILD layer and the sidewall portions of the metal layer in the capacitor opening.

Figure 3D:
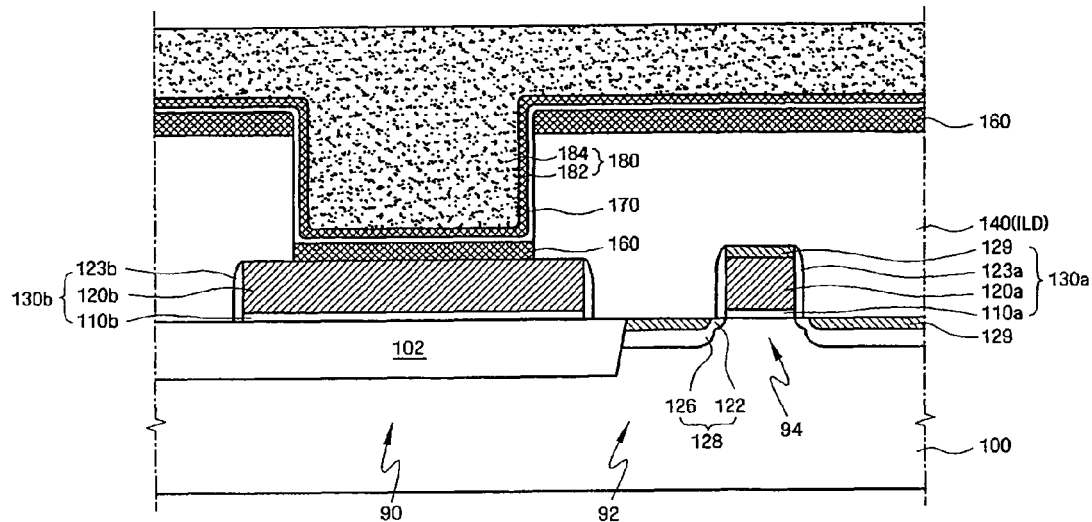

Referring to FIG. 3D, the metal layer 160 is segmented into separated portions using an etching process, for example, a wet etching process. As a result of the wet etch, the sidewalls of the metal layer 160 that formerly coated the inner sidewalls of the capacitor opening 152 are removed and the inner sidewalls of the capacitor opening 152 are exposed. Accordingly, a first portion of the metal layer 160 at the bottom surface of the enlarged capacitor opening remains, to provide a lower electrode 160 for the MIM capacitor. A second portion of the metal layer 160 on the ILD 140 also remains at this time.

A capacitor dielectric layer 170 is then formed on the resulting structure, coating the second portion of the metal layer 160 on the ILD 140, and coating the inner sidewalls and a bottom surface of the capacitor opening 152 on the lower electrode 160. In exemplary embodiments, the capacitor dielectric layer 170 comprises a material selected from the group of materials consisting of a high-k dielectric material, an oxide, an oxide-nitride-oxide structure, and combinations thereof.

A capacitor upper electrode layer 180 is then provided on the resulting structure, covering the top and side surfaces of the capacitor dielectric layer 170, and filling the capacitor opening. In one example, the upper electrode layer comprises a first upper electrode layer 182 and a second upper electrode layer 184. The first upper electrode layer 182 comprises a thin layer that promotes adhesion of the first upper electrode layer with the capacitor dielectric layer, and has diffusion barrier properties, and can comprise, for example, a material selected from the group consisting of TiN, TaN, WN, HfN, ZrN, other metal nitrides, and combinations thereof. The second upper electrode layer 184 comprises a metal fill material that offers superior fill properties, and low resistance, and can comprise, for example, Cu or W.

Figure 3E:
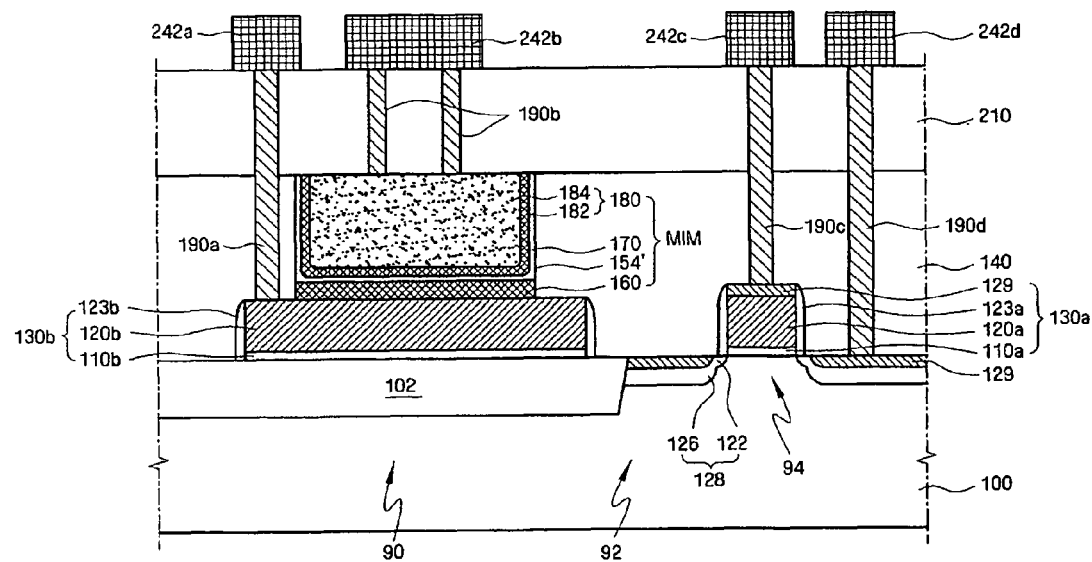

Referring to FIG. 3E a polishing process is performed, for example a chemical-mechanical polishing (CMP) process to remove material from the structure so that the ILD layer 140 is exposed. The top portions of the second upper electrode layer 184, the first upper electrode layer 182, the capacitor dielectric layer 170, and the metal layer 160 that lie above the level of the top of the ILD layer 140 are thereby removed. The MIM-type capacitor MIM, including the lower electrode 160, the capacitor dielectric layer 170, and the upper electrode 180 comprising the first and second upper electrode layers 182, 184, is thereby formed on the upper surface of the second gate stack 130b. In this embodiment, a second ILD layer 210 is formed on the resulting structure, and is planarized. The second ILD layer 210 is formed to a desired height such that upper level interconnection vias 242a, 242b, 242c, 242d formed on the second ILD layer 210 lie at a desired level. Prior to formation of the vias, contact holes are formed through the second and first ILD layers 210, 140 to expose an upper region of the second gate polysilicon layer pattern 120b, the upper capacitor electrode 184, the silicide layer 129 on the first gate stack 130a and the silicide layer 129 on the source/drain region 128 of the transistor in the active region. A metal fill is then provided in the openings to form vertical contacts 190a, 190b, 190c, 190d. The contact 190b coupled to the upper capacitor electrode 184 and the contact 190a coupled to the second gate polysilicon pattern 120b/lower electrode 180 may each optionally comprise multiple contacts 190b, 190a to decrease resistance and improve current flow. The upper level interconnection vias 242a, 242b, 242c, 242d are then formed on the second ILD layer 210 in contact with upper portions of the contacts 190a, 190b, 190c, 190d for routing the signals to other portions of the device.

In the above exemplary embodiment, only a single additional photomask is required for defining the components of the MIM-type capacitor. Thus, an improvement in fabrication efficiency is realized. In addition, since the capacitor is an MIM-type capacitor, it offers the characteristically advantageous VCC properties. In addition, because the MIM-type capacitor of the present embodiment is formed on a lower level of the device, directly above the substrate, a wide routing area can be provided above the device.

Figure 4:
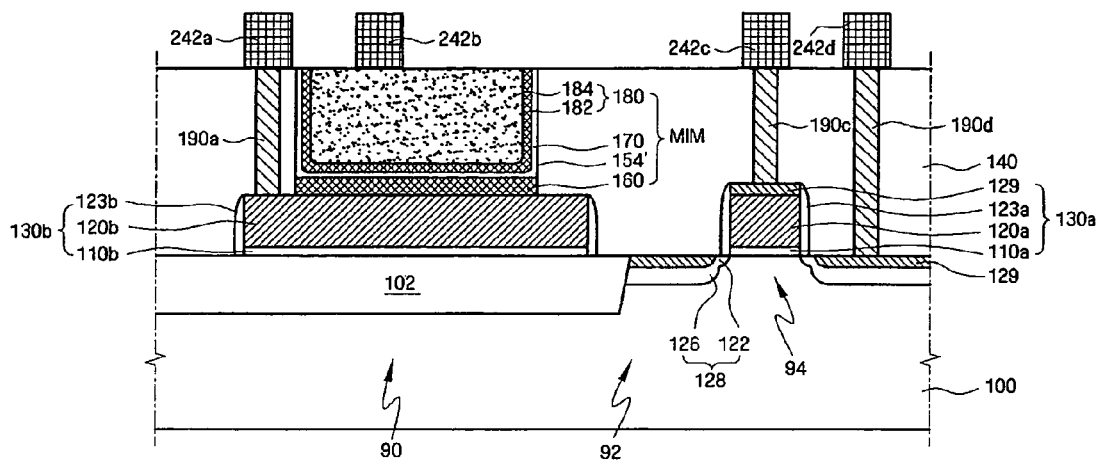
FIG. 4 is a cutaway side view of an integrated MIM capacitor device, in accordance with a fourth embodiment of the present invention.

FIG. 4 is a cutaway side view of an integrated MIM capacitor device, in accordance with a fourth embodiment of the present invention. The embodiment of FIG. 4 is substantially the same in structure, and can be fabricated in substantially the same manner, as that of the third embodiment of FIGS. 3A-3E. A difference in the present fourth embodiment lies in that following CMP polishing of the upper portions of the second upper electrode layer 184, the first upper electrode layer 182, the capacitor dielectric layer 170, and the metal layer 160 that lie above the level of the top of the ILD layer 140, a second ILD layer 210 is not formed, as in the third embodiment. Instead, in the present fourth embodiment, contact holes are formed in the first ILD layer 140 at this time to expose an upper region of the second gate polysilicon layer pattern 120b, the silicide layer 129 on the first gate stack 130a and the silicide layer 129 on the source/drain region 128 of the transistor 94 in the active region 92. A metal fill is then provided in the openings to form vertical contacts 190a, 190c, 190d. The upper level interconnection vias 242a, 242c, 242d are then formed on the first ILD layer 140 in contact with upper portions of the contacts 190a, 190c, 190d for routing the signals to other portions of the device. In addition, the upper level interconnection via 242b is placed in direct contact with the upper electrode 180 of the MIM-type capacitor MIM.

Figure 9:
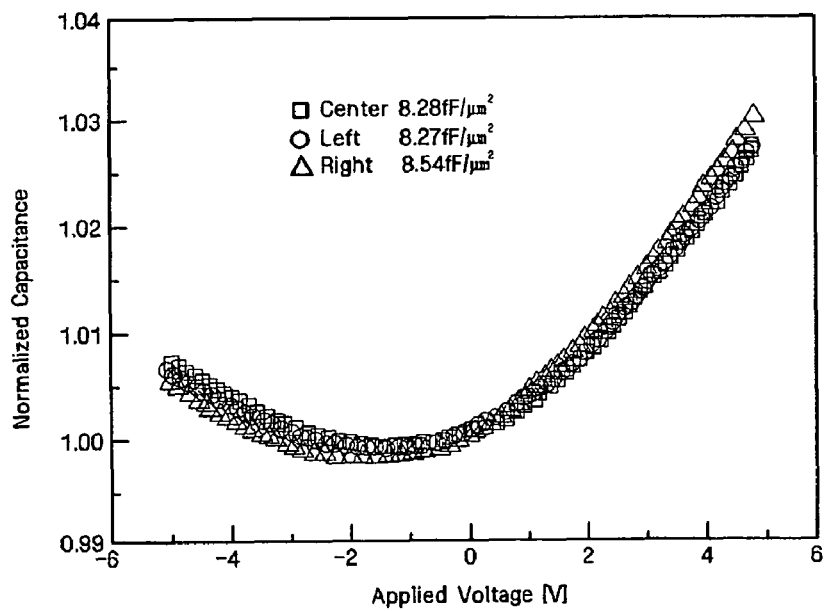
FIG. 9 is a chart of experimental data indicating repeatability in providing a normalized capacitance value as a function of applied voltage, for MIM capacitors fabricated on different regions of a wafer, in accordance with the present invention.

An experiment was conducted to verify the efficacy of the various embodiments disclosed herein. For purposes of the experiment, capacitors were formed in a wafer, with the first upper dielectric layer 182 of the upper electrodes 180, and the lower electrodes 160, comprising titanium nitride, and the dielectric layer 170 comprising hafnium oxide at a thickness of about 200 angstroms. The resulting capacitance was on the order of 8 fF/$\mu m^2$, as shown in the chart of FIG. 9. Upper metal lines were not employed; instead, data were taken using probes in direct contact with the polysilicon patter/lower electrode and upper electrode of the capacitors.

Figure 5:
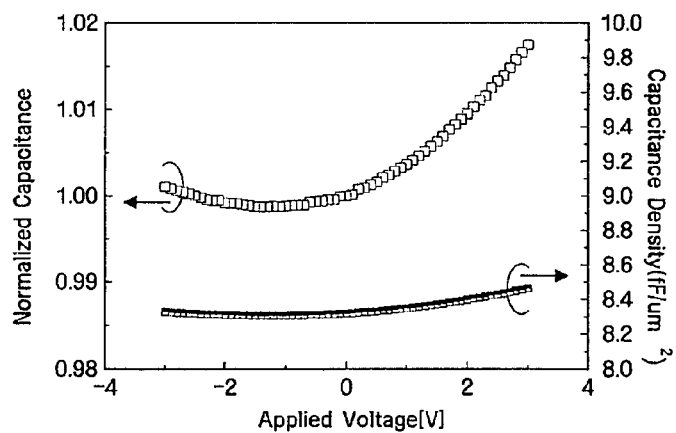
FIG. 5 is a chart of experimental data indicating relatively stable capacitance density as a function of applied voltage, for an MIM capacitor fabricated in accordance with the present invention.

FIG. 5 is a chart of experimental data indicating relatively stable capacitance density as a function of applied voltage, for an MIM capacitor fabricated in accordance with the present invention. The value of the capacitance density is on the order of 8 fF/$\mu m^2$, which is greater than that of a typical PIP capacitor capacitance density value of about 4 fF/$\mu m^2$, and much greater than a typical MIM-type capacitor capacitance value of about 1 to 2 fF/$\mu m^2$.

Figure 6:
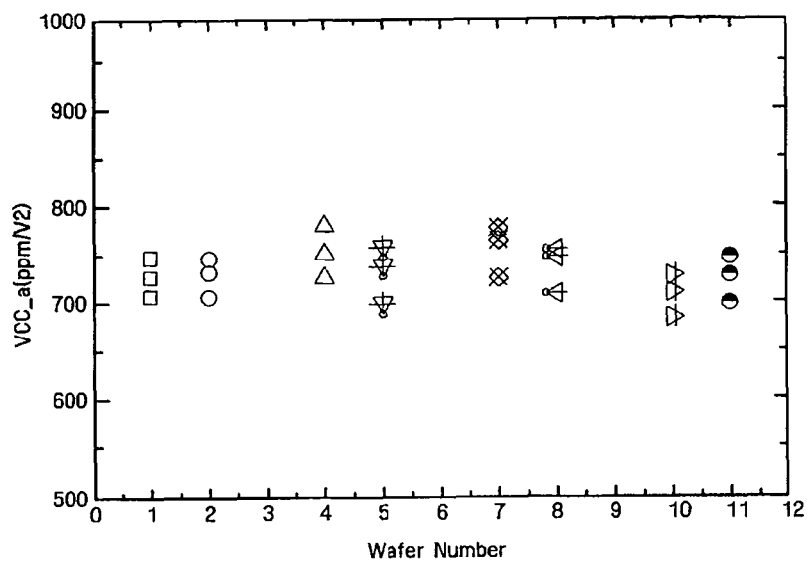
FIG. 6 is a chart of experimental data indicating repeatability of VCC value as a function of wafer number for MIM capacitors fabricated according to eight different fabrication processes, in accordance with the present invention.

FIG. 6 is a chart of experimental data indicating repeatability of VCC value as a function of wafer number, for MIM capacitors fabricated according to eight different fabrication processes, in accordance with the present invention. The eight different fabrication processes are described below in connection with FIG. 11. A relatively low VCC value on the order of 700 ppm/$V^2$ is demonstrated, irrespective of wafer number. This is compared to a typical PIP capacitor, which typically has a VCC value on the order of 3000 ppm/$V^2$. This chart demonstrates that stable VCC values are achieved, even under different process conditions.

Figure 7:
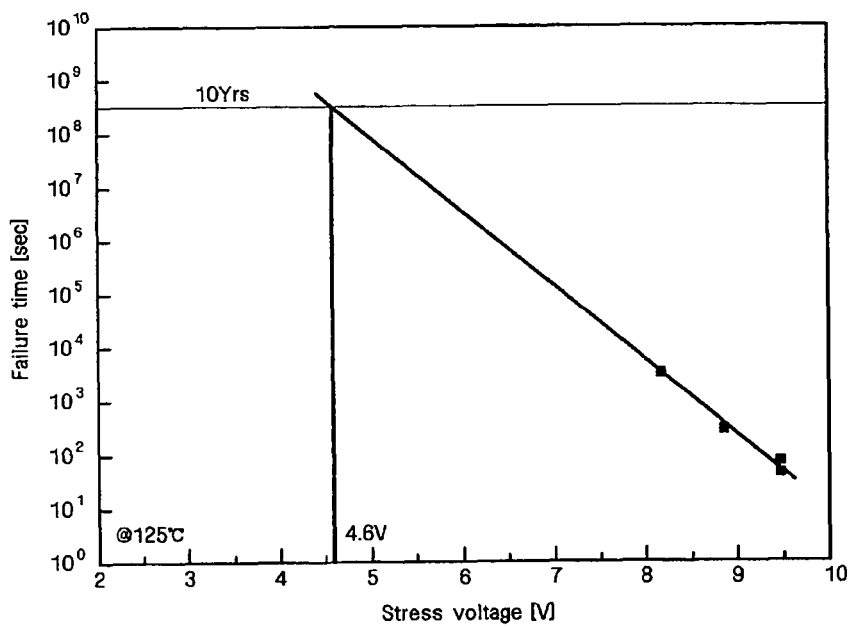
FIG. 7 is a chart of experimental data indicating failure time as a function of stress voltage, for an MIM capacitor fabricated in accordance with the present invention.

FIG. 7 is a chart of experimental data indicating failure time as a function of stress voltage, for an MIM capacitor fabricated in accordance with the present invention. The data demonstrates that a long lifetime can be expected at an operating voltage of 3.3 V, the typical voltage used in a CMOS image sensor (CIS) that may utilize an MIM capacitor in accordance with the present invention.

Figure 8:
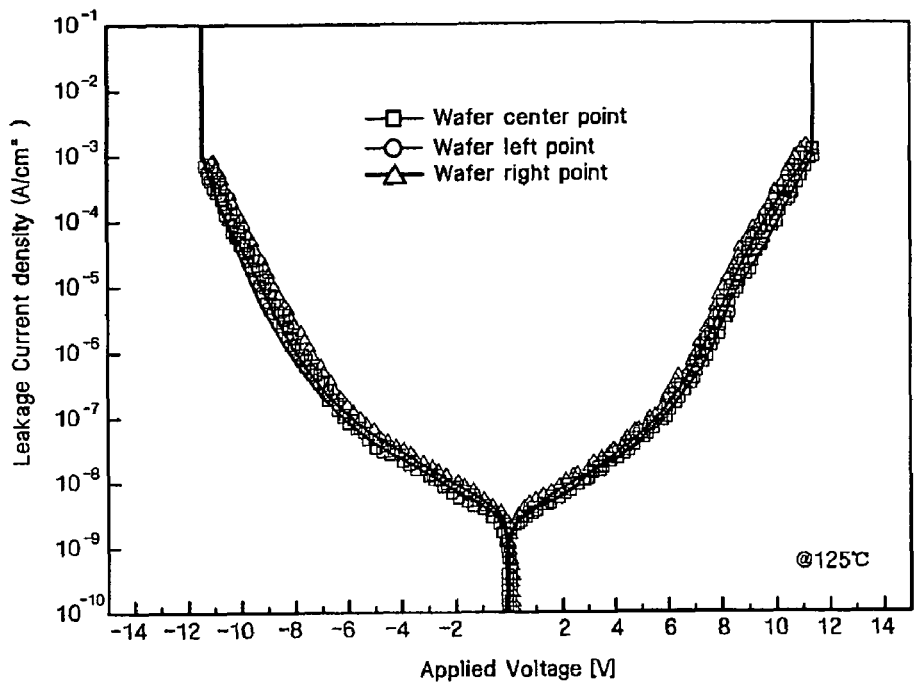
FIG. 8 is a chart of experimental data indicating a relatively stable leakage current density as a function of applied voltage, for MIM capacitors fabricated on different regions of a wafer, in accordance with the present invention.

FIG. 8 is a chart of experimental data indicating a relatively stable leakage current density as a function of applied voltage, for MIM capacitors fabricated on different regions of a wafer, in accordance with the present invention. The data demonstrates consistency in the leakage current density characteristics as a function of wafer position;

FIG. 9 is a chart of experimental data indicating repeatability in providing a normalized capacitance value as a function of applied voltage, for MIM capacitors fabricated on different regions of a wafer, in accordance with the present invention. The data demonstrates consistency in the normalized capacitance value as a function of wafer position.

Figures 10, 11:
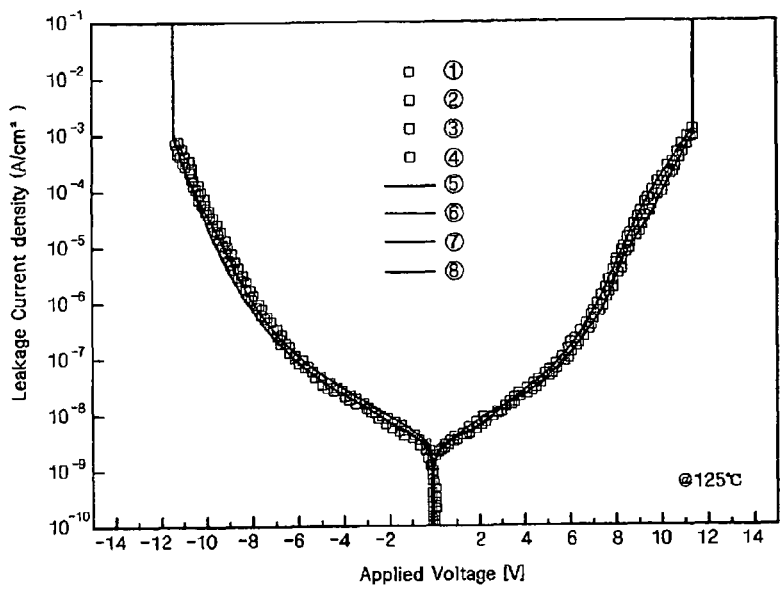
FIG. 10 is a chart of experimental data indicating leakage current density as a function of applied voltage, for MIM capacitors fabricated according to eight different fabrication processes, in accordance with the present invention.
FIG. 11 is a table of the eight fabrication processes leading to the experimental data of FIGS. 6 and 10, in accordance with the present invention.

FIG. 10 is a chart of experimental data indicating leakage current density as a function of applied voltage, for MIM capacitors fabricated according to eight different fabrication processes, in accordance with the present invention. FIG. 11 is a table of the eight fabrication processes leading to the experimental data of FIG. 10, in accordance with the present invention. The data demonstrates consistency in the leakage current density characteristics across the various fabrication processes employed.

In this manner, disclosed herein are semiconductor devices including MIM-type capacitors, and methods of fabrication thereof. In particular, semiconductor devices are disclosed that each include an MIM-type capacitor that is formed on a patterned conductor layer that is used to form a gate layer of a transistor on another portion of the semiconductor device. The resulting MIM-type capacitor provides high-performance operation, as the electrodes are formed of a metal material, and therefore do not have a significant depletion region, and also provides a wide routing area for metal interconnection, since the MIM-type capacitor is formed below the lower routing layers of the device.

While the foregoing has described what are considered to be the best mode and/or other preferred embodiments, it is understood that various modifications may be made herein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A semiconductor device, comprising:
   a semiconductor substrate;
   an insulator at a top portion of the substrate, defining an insulator region;
   a conductive layer pattern on the substrate, the conductive layer pattern being patterned from a common conductive layer, the conductive layer pattern including a first pattern portion on the insulator in the insulator region and a second pattern portion on the substrate in an active region of the substrate, wherein the second pattern portion comprises a gate of a transistor in the active region; and
   a capacitor on the insulator in the insulator region, the capacitor including: a lower electrode on the first pattern portion of the conductive layer pattern, a dielectric layer pattern on the lower electrode, and an upper electrode on the dielectric layer pattern, wherein the upper electrode comprises a first upper electrode layer pattern on the dielectric layer pattern and a second upper electrode layer pattern on the first upper electrode layer pattern, and wherein a portion of the first upper electrode layer pattern is on the second upper electrode layer pattern.

2. The semiconductor device of claim 1 wherein the substrate comprises one selected from the group consisting of: a bulk semiconductor substrate, a silicon-on-insulator structure, and a semiconductor substrate having an epitaxial layer grown thereon.

3. The semiconductor device of claim 1 wherein the insulator comprises a shallow trench isolation (STI) or local oxidation of silicon (LOCOS) structure.

4. The semiconductor device of claim 1 wherein the conductive layer comprises polysilicon.

5. The semiconductor device of claim 1 further comprising a gate insulator layer pattern on the substrate below the second pattern portion of the conductive layer pattern in the active region.

6. The semiconductor device of claim 5 wherein the gate insulator layer pattern is further on the insulator below the first pattern portion of the conductive layer pattern in the insulator region.

7. The semiconductor device of claim 1 wherein the lower electrode comprises a metal selected from the group consisting of: Ti, Ta, W, Hf, Zr, TiN, TaN, WN, HfN, ZrN, and alloys thereof.

8. The semiconductor device of claim 1 wherein the dielectric layer pattern comprises a dielectric material selected from the group consisting of: a high-k dielectric material, an oxide material, and an oxide-nitride-oxide (ONO) structure.

9. The semiconductor device of claim 1 wherein the first upper electrode layer pattern comprises a metal selected from the group consisting of: TiN, TaN, WN, HfN, ZrN, and other metal nitrides.

10. The semiconductor device of claim 1 wherein the second upper electrode layer pattern comprises a metal selected from the group consisting of: Cu and W.

11. The semiconductor device of claim 1 wherein the dielectric layer pattern is further positioned along sidewalls of the upper electrode.

12. The semiconductor device of claim 1 further comprising an interlayer insulator layer on the substrate, and wherein the capacitor is formed through the interlayer insulator layer.

13. The semiconductor device of claim 12 wherein the capacitor is on a portion of the first pattern portion of the conductive layer pattern, and wherein a lower electrode contact extends through the interlayer insulator layer and contacts an upper surface of another portion of the first pattern portion of the conductive layer pattern.

14. The semiconductor device of claim 12 further comprising an upper electrode contact that extends through the interlayer insulator layer and contacts an upper surface of the upper electrode.

15. The semiconductor device of claim 14 wherein the upper electrode contact comprises multiple contacts.

16. The semiconductor device of claim 14 wherein the interlayer insulator layer comprises a first interlayer insulator layer and further comprising a second interlayer insulator layer on the capacitor and on the first interlayer insulator layer, and wherein the upper electrode contact extends through the second interlayer insulator layer to contact the upper surface of the upper electrode.

17. The semiconductor device of claim 16 further comprising an interconnect via on the second interlayer insulator layer contacting the upper electrode contact.

18. The semiconductor device of claim 12 further comprising interconnect vias on the interlayer insulator layer and on the capacitor, at least one of the interconnect vias being in direct contact with the upper electrode.

19. The semiconductor device of claim 1 further comprising an interlayer insulator layer on the substrate, wherein the capacitor is formed in an opening in the interlayer insulating layer, and wherein the lower electrode is formed exclusively on a bottom surface of the opening.

20. The semiconductor device of claim 1 further comprising an interlayer insulator layer on the substrate, wherein the capacitor is formed in an opening in the interlayer insulating layer, and wherein a portion of the dielectric layer pattern is directly in contact with the interlayer insulating layer on a sidewall of the opening.

21. The semiconductor device of claim 1 further comprising a first interlayer insulator layer on the substrate and a second interlayer insulator layer on the first interlayer insulator layer, wherein an upper surface of the upper electrode is coplanar with an upper surface of the first interlayer insulator layer.

* * * * *